United States Patent
Goetzenberger et al.

(10) Patent No.: US 11,009,533 B2
(45) Date of Patent: May 18, 2021

(54) METHOD FOR DETERMINING DEVIATIONS BETWEEN ACTUAL MEASURED CURRENT VALUES AND SETPOINT CURRENT VALUES IN A PLURALITY OF PARALLEL-CONNECTED CURRENT-REGULATED CIRCUIT PATHS

(71) Applicant: VITESCO TECHNOLOGIES GMBH, Hannover (DE)

(72) Inventors: Martin Goetzenberger, Ingolstadt (DE); Rainer Gietl, Regensburg (DE)

(73) Assignee: Vitesco Techologies GmbH, Hannover (DE)

( * ) Notice: Subject to any disclaimer, the term of this patent is extended or adjusted under 35 U.S.C. 154(b) by 369 days.

(21) Appl. No.: 15/196,077

(22) Filed: Jun. 29, 2016

(65) Prior Publication Data

US 2016/0377661 A1    Dec. 29, 2016

(30) Foreign Application Priority Data

Jun. 29, 2015  (DE) .......................... 102015212080.5

(51) Int. Cl.
*G01R 19/25* (2006.01)
*G01R 31/42* (2006.01)

(52) U.S. Cl.
CPC ......... *G01R 19/2506* (2013.01); *G01R 31/42* (2013.01)

(58) Field of Classification Search
None
See application file for complete search history.

(56) References Cited

U.S. PATENT DOCUMENTS

| | | | | | |
|---|---|---|---|---|---|
| 4,845,413 | A | * | 7/1989 | Hackl | H02P 7/2985 388/805 |
| 5,161,393 | A | * | 11/1992 | Payne | D06F 39/003 68/12.04 |
| 5,319,297 | A | * | 6/1994 | Bahn | H02P 25/098 318/701 |

(Continued)

FOREIGN PATENT DOCUMENTS

| | | |
|---|---|---|
| CN | 1313978 A | 9/2001 |
| CN | 102236084 A | 11/2011 |

(Continued)

*Primary Examiner* — Lisa E Peters
(74) *Attorney, Agent, or Firm* — Laurence A. Greenberg; Werner H. Stemer; Ralph E. Locher

(57) ABSTRACT

A method determines deviations between actual measured current values and setpoint current values in a number n (n≥2) of parallel-connected current-regulated circuit paths for the connection of a load with an energy source. A measurement of the total actual current value flowing from the energy source to the load is effected by a precision current measuring device with a low accuracy tolerance, and the measurement of partial currents in the circuit paths is effected by standard current measuring devices with a greater accuracy tolerance, in relation to the precision current measuring device. By an adjustment of the partial currents in the circuit paths, while maintaining a constant total current, values are obtained for a n-dimensional equation system corresponding to the number of circuit paths, the resolution of which, in the knowledge of the accurate total actual current, gives the deviations in the actual values of the partial currents.

8 Claims, 3 Drawing Sheets

(56) References Cited

U.S. PATENT DOCUMENTS

| | | | |
|---|---|---|---|
| 6,577,989 B2 | 6/2003 | Florin | |
| 2001/0035730 A1* | 11/2001 | Yoshikawa | H02P 8/34 318/685 |
| 2004/0108824 A1* | 6/2004 | Ueda | H02P 25/032 318/114 |
| 2004/0260501 A1* | 12/2004 | Fey | B60T 8/885 702/117 |
| 2005/0047182 A1* | 3/2005 | Kraus | H02M 7/493 363/71 |
| 2007/0030016 A1* | 2/2007 | Schumacher | B60R 21/0173 324/678 |
| 2007/0200538 A1* | 8/2007 | Tang | H02M 3/157 323/237 |
| 2011/0057645 A1* | 3/2011 | Jager | B60T 8/36 324/125 |
| 2011/0068819 A1* | 3/2011 | Sims | G01R 31/40 324/764.01 |
| 2012/0217946 A1* | 8/2012 | Ju | H02M 3/156 323/285 |
| 2012/0323436 A1* | 12/2012 | Grieser-Schmitz | B60T 13/66 701/34.4 |
| 2015/0015235 A1* | 1/2015 | Brendel | G01R 19/0092 324/76.11 |
| 2015/0198642 A1* | 7/2015 | Pasqualetto | G01R 31/40 324/691 |
| 2015/0219696 A1 | 8/2015 | Eckrich et al. | |
| 2015/0346312 A1 | 12/2015 | Eckrich et al. | |
| 2017/0123014 A1* | 5/2017 | Goetz | H02M 7/483 |

FOREIGN PATENT DOCUMENTS

| | | | | |
|---|---|---|---|---|
| CN | 102778600 A | | 11/2012 | |
| CN | 104603631 A | | 5/2015 | |
| DE | 3602496 A1 | * | 7/1987 | ............. H02M 7/493 |
| DE | 102006041266 A1 | * | 3/2008 | ......... G01R 19/0092 |
| DE | 102010028066 A1 | | 10/2011 | |
| DE | 102011075382 A1 | * | 11/2012 | ............. B60L 15/20 |
| DE | 102011075382 A1 | | 11/2012 | |
| DE | 102012215946 A1 | | 5/2014 | |
| DE | 102012224112 A1 | | 6/2014 | |
| WO | WO-9747079 A1 | * | 12/1997 | ................ H02P 6/10 |

* cited by examiner

METHOD FOR DETERMINING DEVIATIONS BETWEEN ACTUAL MEASURED CURRENT VALUES AND SETPOINT CURRENT VALUES IN A PLURALITY OF PARALLEL-CONNECTED CURRENT-REGULATED CIRCUIT PATHS

CROSS-REFERENCE TO RELATED APPLICATION

This application claims the priority, under 35 U.S.C. § 119, of German application DE 10 2015 212 080.5, filed Jun. 29, 2015; the prior application is herewith incorporated by reference in its entirety.

BACKGROUND OF THE INVENTION

Field of the Invention

For the regulation of current, current converters such as e.g. DC/DC converters of higher capacity ratings use current measuring devices, frequently consisting of measuring resistors (shunts) with associated instrument amplifiers. At higher capacity ratings, in many cases, a plurality of separate current-regulated current paths incorporating switching elements are connected and operated in parallel, in order to restrict the loading of individual components such as, for example, the switching elements. In the event of correct phase selection, parallel connection also has a positive influence upon the loading of passive storage components, specifically upon the input and output capacitors of DC/DC converters.

For the prevention of the overloading of one of the circuit paths, for example one of the partial converters, it is customary to operate the latter with currents which are as consistent as possible. Where temperatures are known, a deliberate inequality in currents for the purposes of temperature balancing is conceivable, but is not customary.

A further arrangement with parallel circuit paths is constituted by a frequency converter. Specifically in frequency converters for multi-phase motors, a plurality of measuring devices is required.

In order to achieve the most consistent possible current loading of the current paths, current measuring devices are generally of the low-tolerance type, and are consequently configured with a low accuracy tolerance. Primarily, this affects the current measuring resistance, the shunt, which must show a limited resistance tolerance. Further components are the instrument amplifier and its circuit wiring components. Higher accuracy requirements are naturally associated with increased costs. Particularly cost-effective methods, such as the measurement of currents on printed conductors or by reference to the drain-source voltage of MOSFETs incorporated in-circuit as switching elements, are ruled out in this case.

For the purposes of current regulation, it must be possible for the individual circuit paths to be supplied with individual setpoint values. This can be achieved e.g. by individual PWM settings and filters, in the case of analog control, or in the form of individual program-internal setpoint values in the case of digital control. Actual measured current values are also available for regulation purposes.

Published, non-prosecuted German patent application DE 10 2011 075 382 A1 discloses a method and a device for the calibration of current measurements in a drive system with a plurality of drive motors, each being of the three-phase type. A partial current measuring device for each phase and a total current measuring device for all phases are provided. Balancing of the partial current measuring devices is achieved, wherein only the relevant phase is energized, and the measured value from the relevant partial current measuring device is compared with the measured value from the total current measuring device. This balancing method is simple to execute, but cannot be undertaken in-service, if the energization of all phases is required.

Published, non-prosecuted German patent application DE 10 2012 215 946 A1 (corresponding to U.S. patent publication No. 2015/0219696) discloses a method for the validation of a measuring result for an electric current by a current sensor incorporated in an electric circuit, wherein a predetermined adjustment to the switching state of the electric circuit is executed, a variation in the electric current associated with the adjustment to the switching state is detected by the current sensor as a measuring result, and the measuring result is validated by the comparison of the adjustment to the switching state and the variation in the electric current.

Published, non-prosecuted German patent application DE 10 2010 028 066 A1 describes a calibration method for a current measuring system for the measurement of the battery current in a motor vehicle. A calibration current is fed through a calibration resistor and the current measuring system, the current measured by the current measuring system is compared with the calibration current, and the calibration of the current measuring system is executed on the basis of the comparison.

SUMMARY OF THE INVENTION

The object of the invention is a method for determining deviations between actual measured current values and setpoint current values in a plurality of parallel-connected current-regulated circuit paths, which can also be executed in-service and which permits the use of cost-effective current measuring devices.

The object is fulfilled by a method for determining deviations between actual measured current values and setpoint current values in a number n, where n≥2, of parallel-connected current-regulated circuit paths for the connection of a load with an energy source. The measurement of a total actual current value flowing from the energy source to the load is effected by a precision current measuring device with a low accuracy tolerance, and the measurement of partial currents in the circuit paths is effected by standard current measuring devices with a greater accuracy tolerance, in relation to the precision current measuring device. The method includes the following steps of:

a) A determination of a total setpoint current value and a total actual current value at two different service points on the circuit paths by the high-accuracy precision current measuring device, in order to determine the offset error thereof;

b) The successive supply of each of the n circuit paths with a setpoint current value which is greater or smaller than the setpoint service current value by a differential current value, and the simultaneous supply of each of the remaining n−1 partial circuit paths with a correspondingly greater or smaller setpoint current value, such that the total current remains constant, whereby the differential current value is smaller than the setpoint service current value;

c) A determination of the total actual current value and the sum of the actual current values on the n−1 partial circuit paths with a smaller or greater setpoint current value;

d) The determination of the respective linear equations which describe the relationship between the differential current value, the measured total actual current value and the sum of the actual current values on the n−1 partial circuit paths, and the entry of the current values thus determined into these equations; and e) The resolution of the equation system thus obtained, with n equations for the n deviations between the inaccurate current values measured by the standard current measuring devices and the actual values, in order to determine the deviations in partial currents for each circuit path.

The measured values may show significant errors, as these can ultimately be identified and compensated. For balancing purposes, a single total measurement is needed, which must show the overall accuracy ultimately required. However, for the synchronism of the partial converters, the absolute accuracy of this current measurement is not critical in itself.

Balancing proceeds in a number of steps. Firstly, measured current values in off-circuit converters are subject to offset correction. This is based upon the simple knowledge that, in an off-circuit converter, the current is demonstrably zero, and any deviating measured values must therefore be associated with an offset in measurement. This offset is considered subsequently.

As the circuit paths can be disconnected for balancing purposes, it is possible for the setting of an appropriate setpoint value and the measurement of current to proceed individually in each circuit path, wherein, for example, on any given converter before and after switching-on, the setpoint value is zero, and on at least one load point the measured setpoint current deviates from zero, i.e. is balanced by the high-accuracy precision current measuring device.

One advantage of the invention is that balancing can be executed in-service, which is necessary as, on the grounds of e.g. temperature drifts associated with very cost-effective shunts in the form of printed copper conductors, or in the case of current measurement on the basis of the drain-source voltage of MOSFETs, a rapid drift in calibrated values occurs.

In frequency converters, in which individual current measurement is effected, for example, with reference to the voltage across the in-circuit MOSFETs, a similar situation occurs in continuous operation. In this case, a total current flowing to the B6 bridges is balanced with the values of individual partial currents.

However, for the balancing of current measurement with reference to the drain-source voltage using a summation shunt, a superior functionality for the measurement of partial currents is available, without the assumption of additional losses and the cost of partial shunts. It is advantageously specified that, in many applications, the detection and clearance of fault states is required. To this end, the determination of output currents is advantageous. If highly cost-intensive methods for direct output current measurement are to be omitted, a measurement of current flowing from the intermediate circuit and a measurement of the ground return current will be absolutely necessary.

This function can be fulfilled by total current and partial current measurements, subject to the selection of appropriate measuring points.

In the operation of an arrangement with a plurality of parallel circuit paths, the balancing of setpoint values with the total actual value detected is executed as a further step. To this end, further to the consideration of the offset value in the total measurement, the setpoint value and the total actual current value are determined on a minimum of two service points, which are sufficiently removed from each other. From the current values detected on these two service points, a linear relationship is determined. Measurements on further service points permit a more accurate determination, e.g. by the calculation of a linear regression. For analog settings, two points are therefore necessary, as the settings for setpoint values may also incorporate offsets. The accurate balancing of a setpoint value with an accurate measured value can be omitted, as the setpoint value can be readjusted on the basis of the accurate measured current value. In the event of an overriding regulation, it is even possible that this will not be necessary.

In a manner according to the invention, the individual parallel-connected current-regulated current paths are supplied with different targeted setpoint values. This is possible within a broad range of operation. Only in limiting current ranges, in which all the partial circuit paths are required to deliver the maximum or minimum current, is this freedom no longer available. In all partial load ranges, however, in a manner according to the invention, a partial converter to be balanced can be supplied with a greater or smaller setpoint value, whereas the remaining partial converters are supplied with a correspondingly smaller or greater setpoint value, such that the total current matches the setpoint value.

From the sum of the actual current values on the n−1 partial circuit paths, the actual total current value measured and the differential current value on the circuit path to be balanced, the linear relationship between the setpoint value adjustment on the circuit path to be balanced and the measured value of the total actual current value can now be determined directly. If this procedure is executed for each circuit path, a deviation can be determined for each circuit path. Naturally, the method is not restricted to a systematically sequential procedure.

In the case of n partial converters, assuming a linear system, all n circuit paths are balanced by n independent linear measurements, as is customary in linear equation systems. For the balancing of non-linear effects, more measuring points are required accordingly. If offset values and deviations in current measurements on the individual circuit paths are known, a balancing of current values can then be achieved by the setting of different setpoint values. In one embodiment of the invention, the method is applied in an arrangement wherein a first circuit path is connected to the load via the precision current measuring device, a second circuit path is connected via a first standard current measuring device to the connection point of the first circuit path with the precision current measuring device and, where applicable, each i-th circuit path where $2<i\leq n$ is connected via an i−1-th standard current measuring device to the connection point of the i−1-th circuit path with the i−2-th standard current measuring device.

Accordingly, in an advantageous manner, the partial current on the n-th circuit path can be determined directly by the n−1-th standard current measuring device, the partial current on the i-th circuit path where $2\leq i<n$ can be determined from the difference between the current measured on the i−1-th standard current measuring device and the current measured on the i-th standard current measuring device, and the partial current on the first circuit path can be determined from the difference between the current measured on the precision current measuring device and the current measured on the first standard current measuring device.

The deviations in actual current values thus determined can be advantageously employed in subsequent measurements, or in the determination of partial currents, for the correction thereof.

In one embodiment of the invention, the circuit paths are constituent elements of regulated switching converters.

In another embodiment of the invention, the circuit paths are constituent elements of frequency converters.

In one embodiment of the invention, a circuit path is formed by a series circuit of two transistors which are connected between the potentials of the energy source, the connection point of which is bonded to the load.

By the invention, high accuracy requirements for current measuring devices can deliberately be waived in the circuit paths. Accordingly, very primitive methods can be considered for use including, e.g. the measurement of a voltage drop on printed conductors, in place of a shunt. The deficient accuracy of measurement is calibrated in-service, on the basis of a single and accurate total current measurement. The partial currents can then be balanced, whereby different setpoint values are applied.

Other features which are considered as characteristic for the invention are set forth in the appended claims.

Although the invention is illustrated and described herein as embodied in a method for determining deviations between actual measured current values and setpoint current values in a plurality of parallel-connected current-regulated circuit paths, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
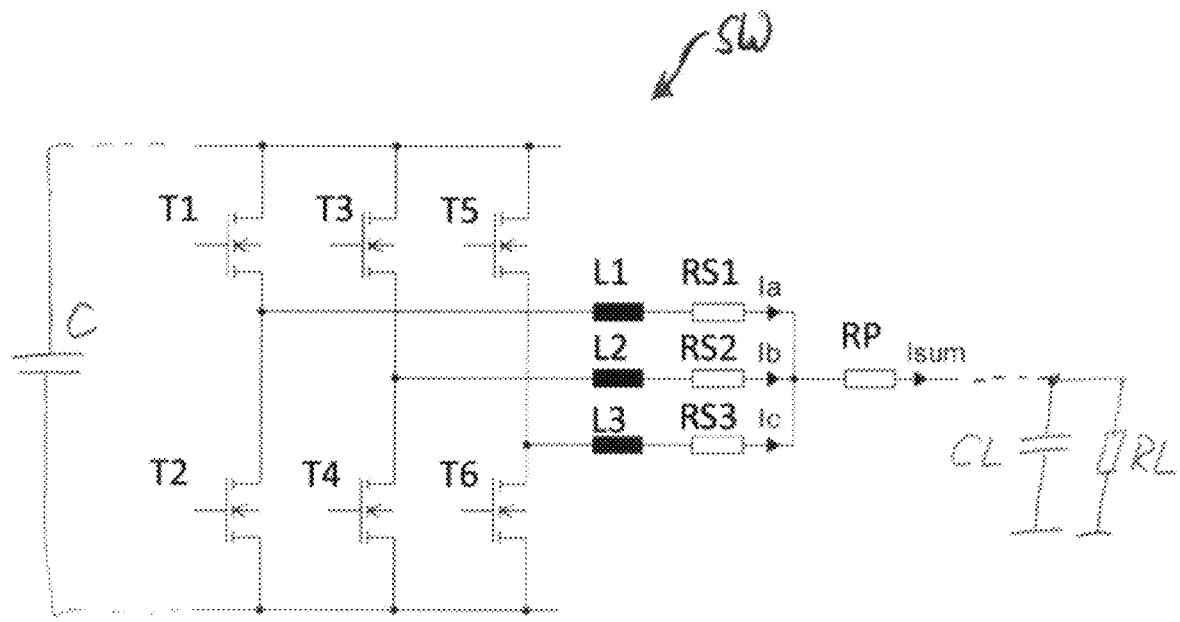
FIG. 1 is a schematic illustration of a first embodiment of a circuit arrangement with switching converters for an application of a method according to the invention.

Referring now to the figures of the drawings in detail and first, particularly to FIG. 1 thereof, there is shown a first exemplary embodiment of a circuit arrangement, by which the method according to the invention can be executed. A switching converter SW is represented, via which energy is to be transmitted from an energy source C, which may be for example a car battery, to a load RL whereby, in the example represented, energy can be stored intermediately in a buffer capacitor CL. The switching converter SW itself is divided into three partial converters, each of which is formed of a circuit path T1, T2 or T3, T4 or T5, T6 with a coil L1 or L2 or L3, and standard current measuring device in the form of a resistor RS1, RS2 or RS3. Each circuit path is formed by the series connection of a first T1 or T3 or T5 and a second MOSFET T2 or T4 or T6, which are connected between the poles of the energy source C.

The connection points of the MOSFET series circuits are bonded via the coils L1 or L2 or L3 and the standard current measuring devices RS1 or RS2 or RS3 to a common connection point, and the latter is connected via a precision current measuring device RP to the parallel circuit of the load resistor RL and the output capacitor CL.

In service, the currents Ia or Ib or Ic flow in the circuit paths and, in combination, form a total current Isum which flows through the precision current measuring device RP. The currents in the partial converters Ia, Ib, Ic are regulated by an unrepresented control device, whereby the currents Ia, Ib, Ic determined by the standard current measuring devices RS1, RS2, RS3 are compared with setpoint current values, and the MOSFETs T1, T3, T5 or T2, T4, T6 are controlled correspondingly, for example by pulse-width modulated signals.

As the standard current measuring devices RS1, RS2, RS3 are formed of line resistors only, or are to be constituted by the forward resistances of the MOSFETs, the actual measured current values Ia, Ib, Ic are relatively inaccurate and, by the method according to the invention, the deviation is to be determined with the switching converter SW still in service, and can be employed for the correction of control.

Figure 2:
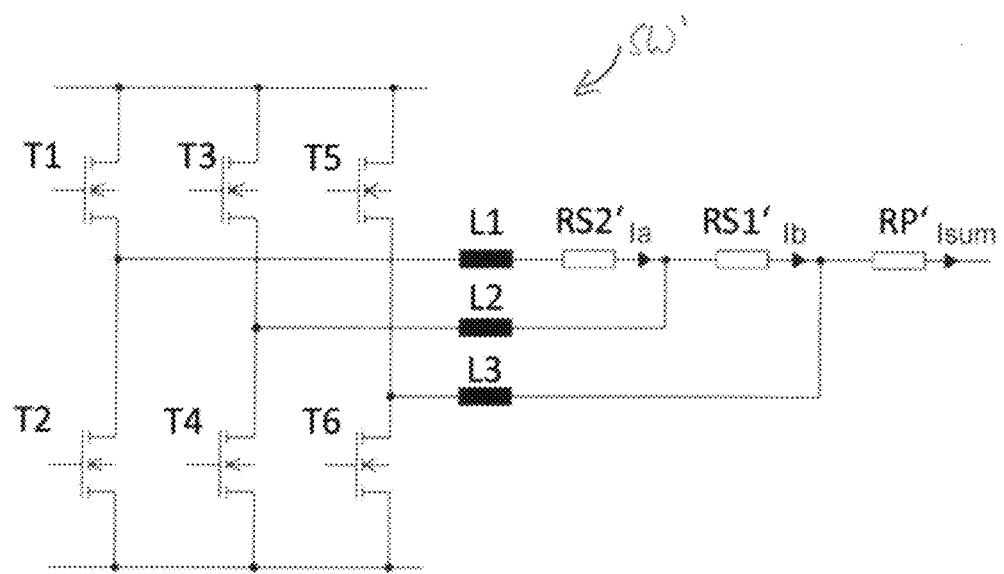
FIG. 2 is a schematic illustration of a second embodiment of the circuit arrangement with switching converters for the application of the method according to the invention, with the formation of a differential current.

To this end, according to the invention, one of the currents Ia or Ib or Ic is sequentially adjusted by a specific differential value, and the two other currents in the total current are adjusted in the other direction by the corresponding magnitude, such that the total current Isum remains at its setpoint value, and the correct supply of the load can be maintained accordingly. By the measurement of actual currents, in the knowledge of the predefined setpoint currents on at least two service points for each adjusted partial converter current Ia, Ib, Ic, and given that the total current Isum is accurately known as a result of the precision current measuring device RP, deviations can be determined by the entry of the values thus defined into an equation system, and applied in subsequent measurements for the correction of the inaccurately measured actual currents a, Ib, Ic. FIG. 2 shows an alternative switching converter arrangement SW', in which the standard measuring devices RS1', RS2' and the precision current measuring device RP' are connected in series between the first coil L1 of the first circuit path T1, T2, L1 and an unrepresented load. The outputs of the two other circuit paths are bonded to the connection points of the individual current measuring devices RS2' and RS1' or RS1' and RP' such that, by this arrangement, one standard current measuring device can be omitted. In this case, however, the actual currents flowing in the circuit paths must be determined by differential formation.

Figure 3:
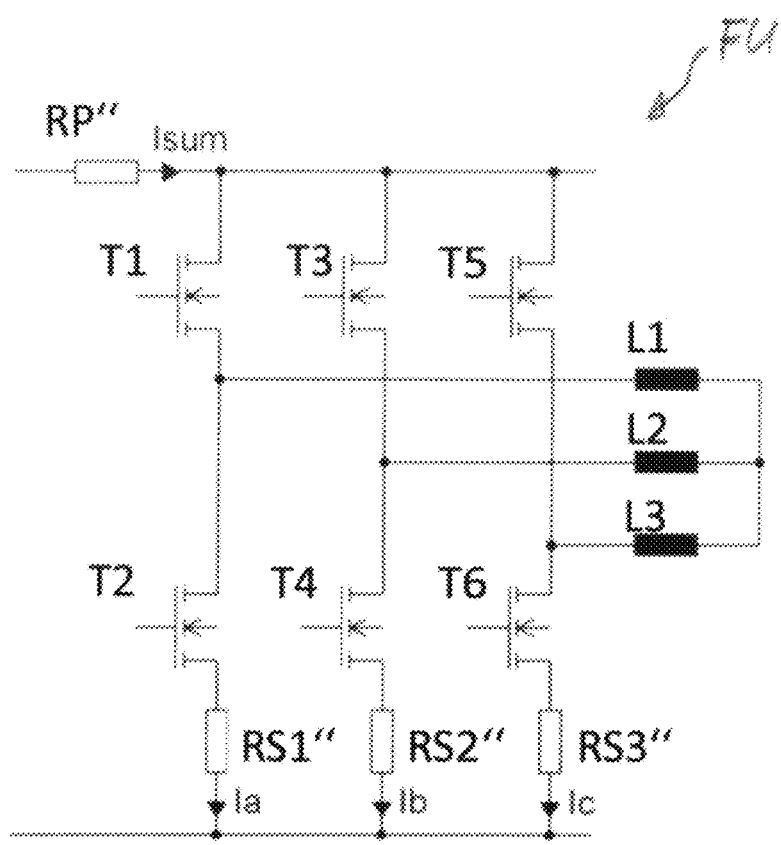
FIG. 3 is a schematic illustration of a third embodiment of the circuit arrangement with a frequency converter for the application of the method according to the invention.
Figure 4:
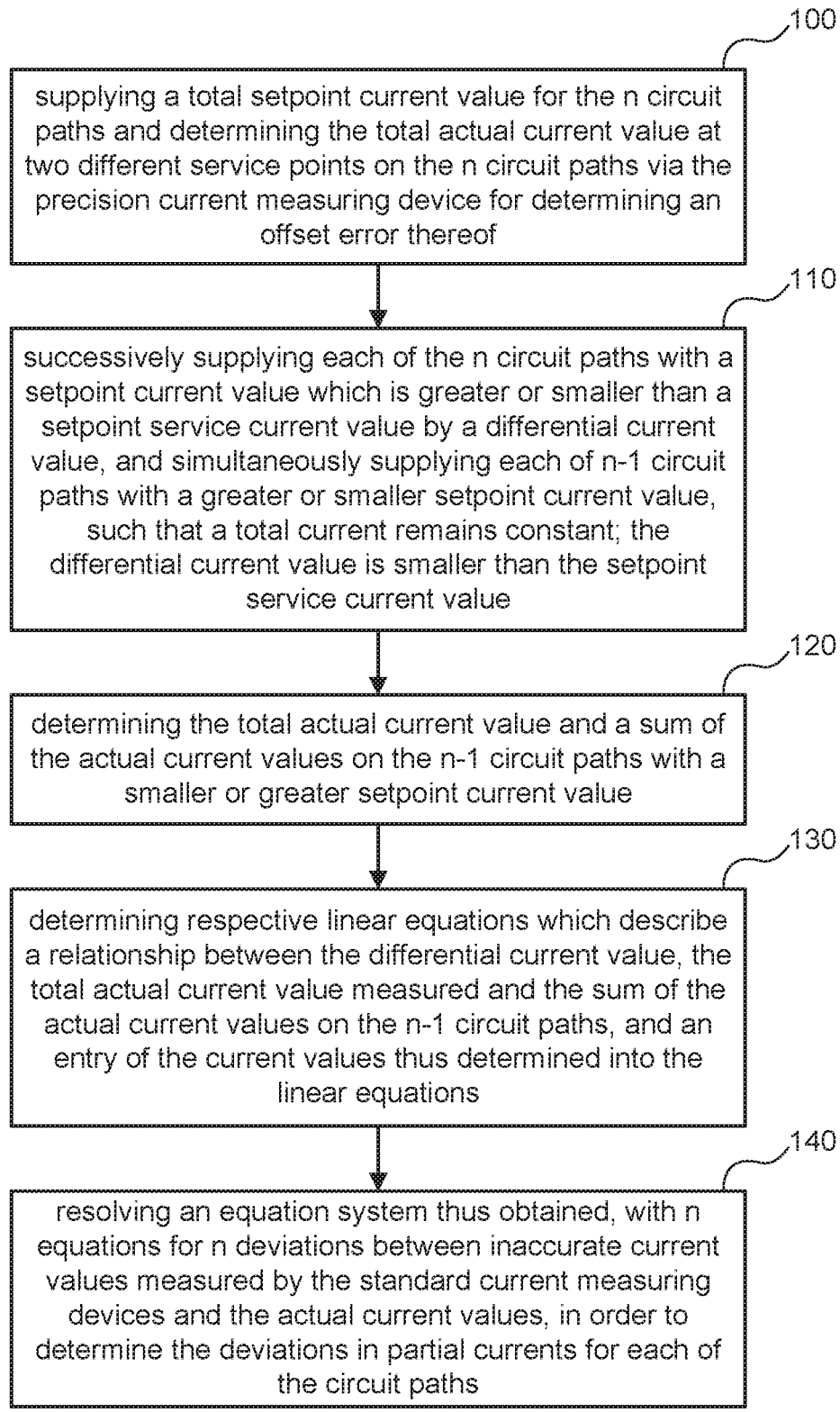
FIG. 4 is a flowchart showing the basic steps of the invention.

FIG. 3 represents a further exemplary embodiment of a circuit arrangement, by which the method according to the invention can be executed, in the form of a frequency converter FU. Here, the coils L1, L2, L3 are interconnected in the circuit paths and are constituent elements of an electric motor, whereas the standard current measuring devices RS1", RS2" or RS3" are connected in series respectively to the associated switching elements T1, T2 or T3, T4 or T5, T6 in the three circuit paths. In the exemplary embodiment represented in FIG. 3, the precision current measuring device RP" is connected in the supply path of the (unrepresented) energy source.

The method is for determining deviations between actual measured current values and setpoint current values in a number n, where n≥2, of parallel-connected current-regulated circuit paths for a connection of a load with an energy source. A measurement of a total actual current value flowing from the energy source to the load is effected by means of a precision current measuring device with a low accuracy tolerance, and a measurement of partial currents in the circuit paths is effected by means of standard current measuring devices with a greater accuracy tolerance, in relation to the precision current measuring device. The method includes at least the following steps. Step 100 includes supplying a total setpoint current value for the n circuit paths and determining the total actual current value at two different service points on the n circuit paths via the precision current measuring device for determining an offset error thereof. Step 110 includes successively supplying each of the n circuit paths with a setpoint current value which is greater or smaller than a setpoint service current value by a differential current value, and simultaneously supplying each of n−1 circuit paths with a greater or smaller setpoint current value, such that a total current remains constant. In this step, the differential current value is smaller than the setpoint service current value. Step 120 includes determining the total actual current value and a sum of the actual current values on the n−1 circuit paths with a smaller or greater setpoint current value. Step 130 includes determining respective linear equations which describe a relationship between the differential current value, the total actual current value measured and the sum of the actual current values on the n−1 circuit paths, and an entry of the current values thus determined into the linear equations. Step 140 includes resolving an equation system thus obtained, with n equations for n deviations between inaccurate current values measured by the standard current measuring devices and the actual current values, in order to determine the deviations in partial currents for each of the circuit paths.

The invention claimed is:

1. A method for determining deviations between actual measured current values and setpoint current values which comprises the following steps of:
   providing a number n of parallel-connected current-regulated circuit paths for a connection of a load with an energy source, wherein n≥2;
   supplying a total setpoint current value for the n circuit paths and determining a first total actual current value at two different service points on the n circuit paths via a precision current measuring device with a low accuracy tolerance for determining an offset error thereof;
   for each one of the n circuit paths, performing an adjustment step by adjusting a current flowing through the one of the n circuit paths by a differential current value in a first direction and adjusting currents flowing through each of n−1 circuit paths by an amount in a second direction that is opposite the first direction such that a total current, being a sum of currents flowing through the n circuit paths, remains constant;
   determining a second total actual current value flowing from the energy source to the load with the precision current measuring device having the low accuracy tolerance;
   for each one of the n circuit paths, after performing the adjustment step, determining actual current values on the n−1 circuit paths with standard current measuring devices having a greater accuracy tolerance in relation to the low accuracy tolerance of the precision current measuring device;
   determining linear equations describing a relationship between:
   the differential current value,
   the second total actual current value that was determined, and
   each sum of the actual current values that were determined on the n−1 circuit paths;
   entering the second total actual current value that was determined and each sum of the actual current values that were determined on the n−1 circuit paths into the linear equations;
   determining deviations in partial currents for each of the n circuit paths by resolving an equation system obtained by entering the second total actual current value that was determined and each sum of the actual current values that were determined on the n−1 circuit paths into the linear equations; and
   using the determined deviations in partial currents for correcting subsequently measured actual currents.

2. The method according to claim 1, wherein the circuit paths are constituent elements of regulated switching converters.

3. The method according to claim 1, wherein the circuit paths are constituent elements of a frequency converter.

4. The method according to claim 1, wherein a circuit path is formed by a series circuit of two transistors which are connected between potentials of the energy source, a connection point of which is bonded to the load.

5. The method according to claim 1, wherein the standard current measuring device is formed by a line section.

6. The method according to claim 1, wherein the standard current measuring device is formed by a load path of a transistor in a circuit path.

7. The method according to claim 1, wherein:
   a first circuit path is connected to the load via the precision current measuring device; and
   a second circuit path is connected via a first standard current measuring device to a connection point of a first circuit path with the precision current measuring device and each i-th circuit path where 2<i≤n is connected via an i−1-th standard current measuring device to a connection point of an i−1-th circuit path with a i−2-th standard current measuring device.

8. The method according to claim 7, which further comprises:
   determining a partial current on an n-th circuit path directly by means of the n−1-th standard current measuring device, the partial current on the i-th circuit path where 2≤i<n is determined from a difference between a current measured on the i−1-th standard current measuring device and a current measured on the i-th standard current measuring device; and
   determining the partial current on the first circuit path from a difference between a current measured on the precision current measuring device and the current measured on the first standard current measuring device.

* * * * *